United States Patent
Izumi et al.

(10) Patent No.: US 7,132,692 B2
(45) Date of Patent: Nov. 7, 2006

(54) NANOSILICON LIGHT-EMITTING ELEMENT AND MANUFACTURING METHOD THEREOF

(75) Inventors: Tomio Izumi, Hiratsuka (JP); Keisuke Sato, Hiratsuka (JP); Mitsuo Iwase, Hiratsuka (JP)

(73) Assignee: Tokai University Educational System, Tokyo (JP)

( * ) Notice: Subject to any disclaimer, the term of this patent is extended or adjusted under 35 U.S.C. 154(b) by 135 days.

(21) Appl. No.: 10/806,377

(22) Filed: Mar. 23, 2004

(65) Prior Publication Data
US 2004/0197943 A1    Oct. 7, 2004

(30) Foreign Application Priority Data
Mar. 27, 2003    (JP)    ............................ 2003-087247

(51) Int. Cl.
*H01L 31/12*    (2006.01)
(52) U.S. Cl. ............................ 257/79; 257/89; 257/103
(58) Field of Classification Search ................ 257/14, 257/22, 88, 89, 103, 79; 438/22–24, 28, 438/29, 40, 41
See application file for complete search history.

(56) References Cited

U.S. PATENT DOCUMENTS 6,103,540 A * 8/2000 Russell et al. ................ 438/22

FOREIGN PATENT DOCUMENTS

JP    7-237995    9/1995

* cited by examiner

*Primary Examiner*—Kevin M. Picardat
(74) *Attorney, Agent, or Firm*—McGinn IP Law Group, PLLC

(57) ABSTRACT

An object of the present invention is to allow the three primary colors of light (red, green, blue) to be emitted, and particularly to allow blue light to be emitted clearly and in a stable manner at a low voltage. An amorphous $SiO_x$ film 2 consisting of a mixture of silicon atoms and oxygen atoms is formed on a semiconductor substrate 1. The result is heat treated in an inert gas to form the silicon atoms into nanosilicon 4a of about 3.0 nm or less. The result is subjected to hydrofluoric acid aqueous solution treatment 5 and thermal oxidation treatment 6. Any of the three primary colors of light, particularly blue, can be emitted at a low operating voltage 7 at room temperature.

21 Claims, 11 Drawing Sheets

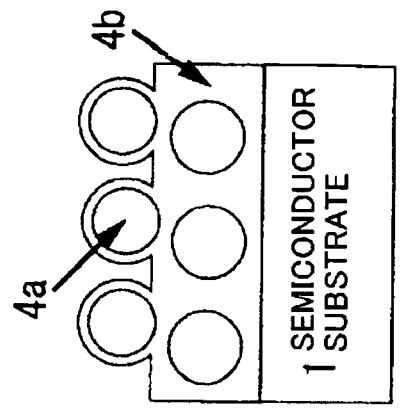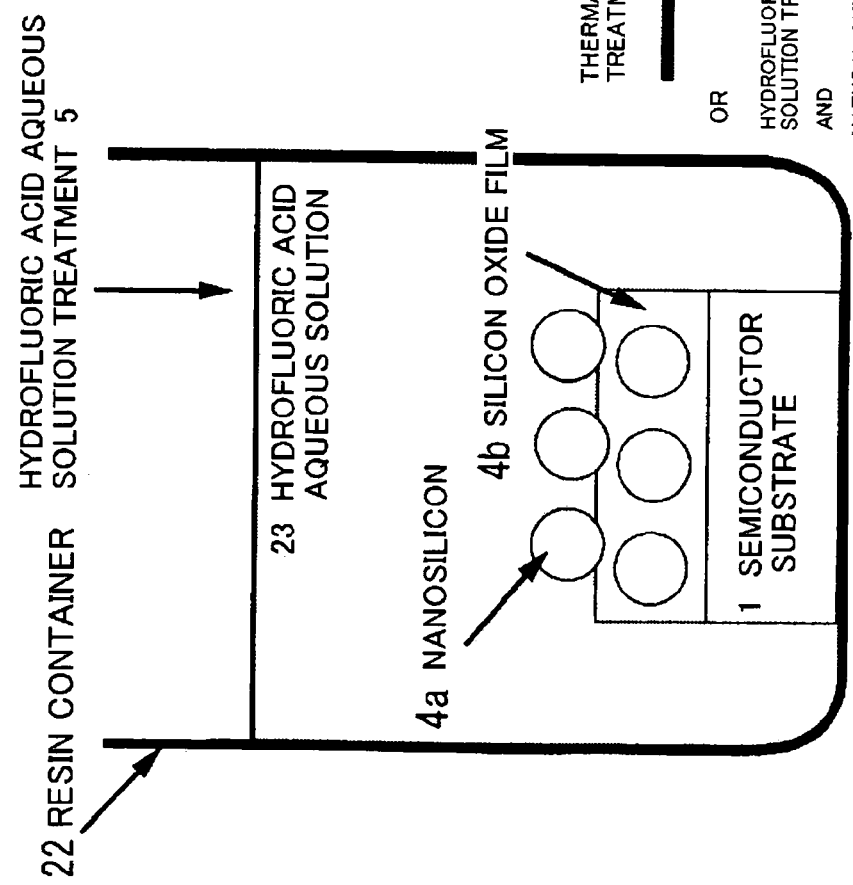

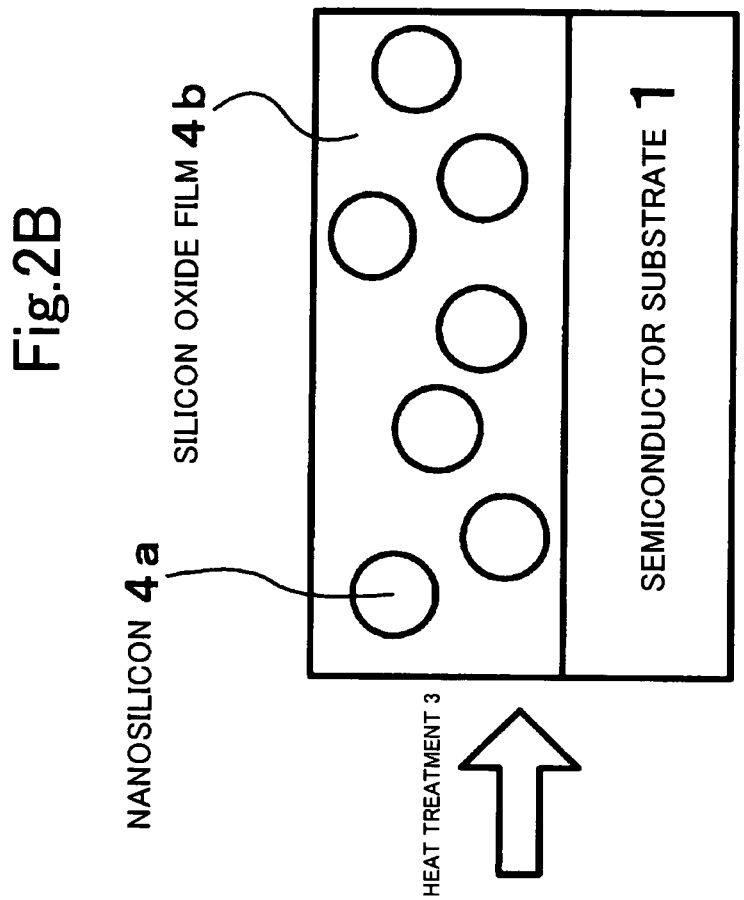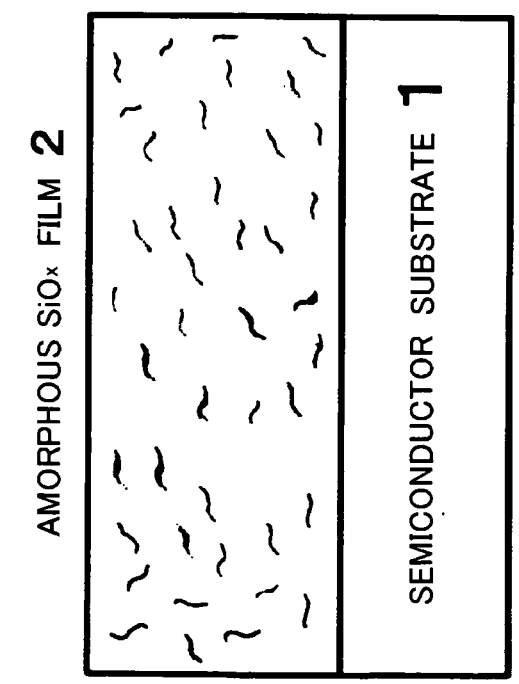

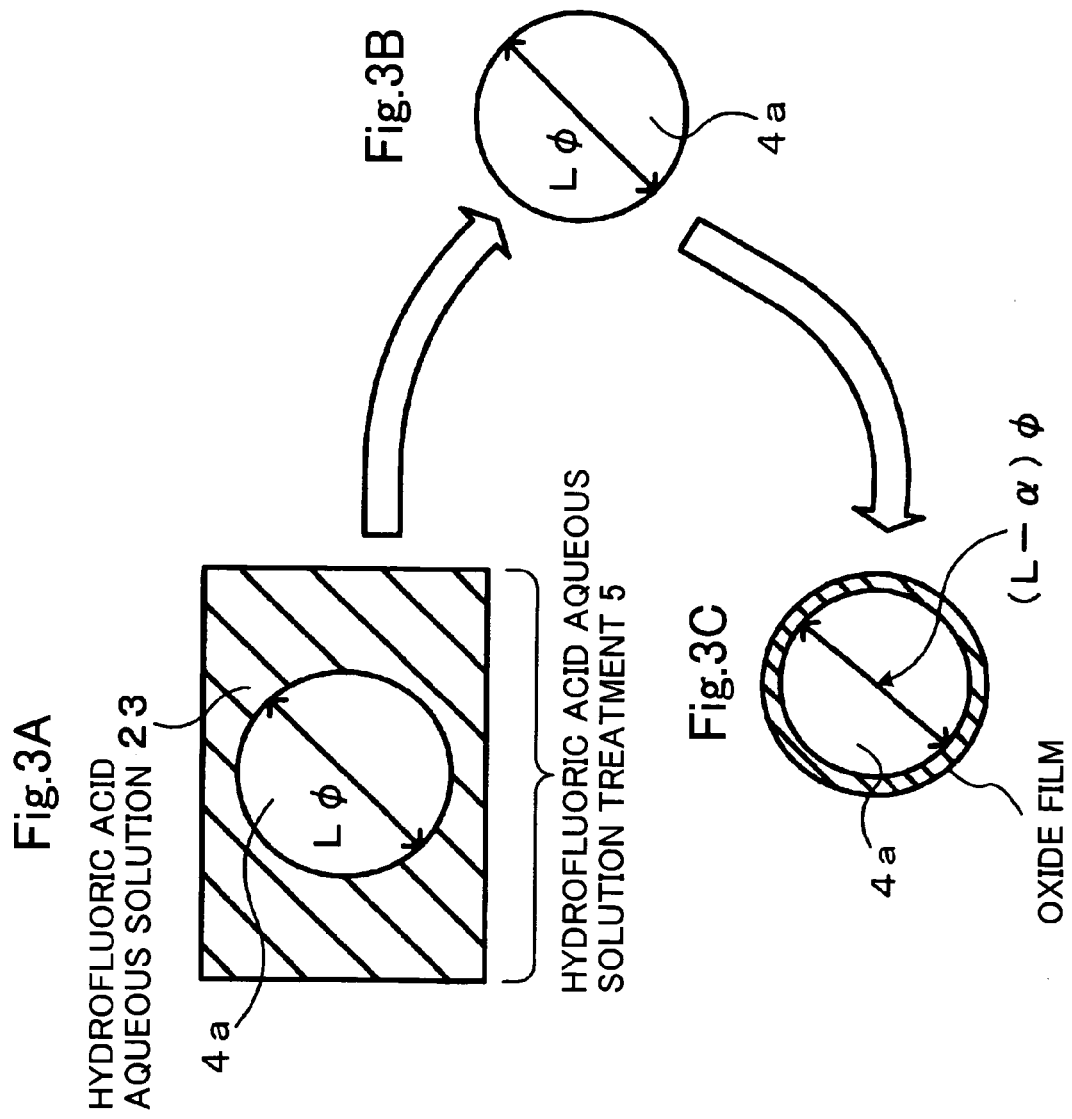

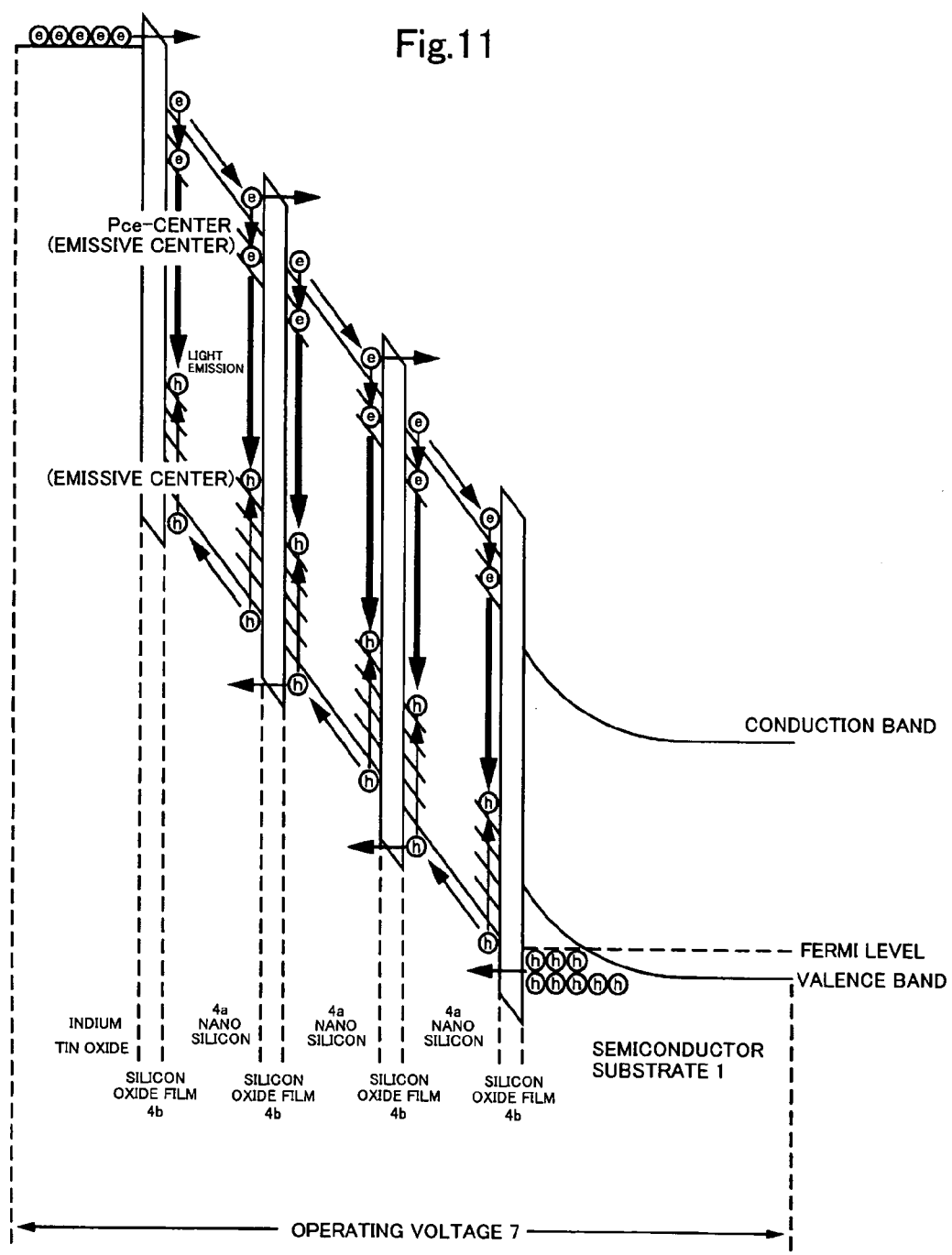

US 7,132,692 B2

NANOSILICON LIGHT-EMITTING ELEMENT AND MANUFACTURING METHOD THEREOF

BACKGROUND OF THE INVENTION

1. Field of the Invention

The present invention relates to a nanosilicon light-emitting element that can emit light in the three primary colors (red, green, blue), and particularly that can emit blue light clearly and in a stable manner under a low voltage; and to a manufacturing method thereof.

2. Description of the Related Art

The present invention also relates to the establishment of a manufacturing process for the nanosilicon light-emitting element and to the development of a nanosilicon-type electroluminescence element. These can be utilized in the sections of light-emitting elements that are incorporated in electroluminescence displays, light-emitting diodes, and other such display devices, or optoelectronic elements and other such optical communication devices, and are therefore expected, as a result of the development of the present invention, to have wide applications in the near future in the versatile field of optoelectronics, including color displays, portable display panels, and the like.

Mainstream light-emitting elements currently use expensive materials that put a great strain on the global environment, which is causing problems that must quickly be solved. Therefore, it is an urgent matter that inexpensive materials that are easy on the natural environment and that make energy conservation possible be used in the development of future light-emitting elements. Nanosilicon is expected to serve as a material that satisfies all of these conditions. Nanosilicon is a material that has been researched since 1980, and exhibits various qualities that are not found in silicon crystals. The luminescence of nanosilicon is the most typical example of such qualities. This luminescence is a result of the band gap energy expanding to the visible region due to the reduction of the size of silicon crystals to a region in which quantum confinement occurs (4.3 nm or less). According to Japanese Patent Application Laid-open No. H7-237995, it has been difficult to reduce the size of silicon crystals in a stable manner, to emit light under a low voltage, and particularly to emit blue light clearly and in a stable manner.

The color of light emitted by a light-emitting element is directly affected by the size of the nanosilicon, and emitted light ranging from red light to blue light is presently being obtained from porous silicon, which is one example of nanosilicon-type material. With porous silicon, however, test specimens are severely degraded, so emission life or intensity cannot be increased, and the material has been regarded as difficult to apply to light-emitting elements. Therefore, the development of nanosilicon capable of long-lasting and luminescent multicolored light emission is considered urgent for practical application in light-emitting elements.

SUMMARY OF THE INVENTION

An object of the present invention is to establish a nanosilicon manufacturing process whereby long-lasting and high-intensity red, green, and blue light can be emitted at room temperature, and the colors of the emitted light can be easily controlled in the development of light-emitting elements that can be applied in the versatile field of optoelectronics. Another object is to develop a nanosilicon-based electroluminescence element.

As a result of earnest research conducted in view of the above situation and intended to solve the above-mentioned problems, the inventors have designed the present invention, which is a nanosilicon light-emitting element wherein an amorphous $SiO_x$ film consisting of a mixture of silicon atoms and oxygen atoms is formed on a semiconductor substrate, the result is heat treated in an inert gas to form the silicon atoms into nanosilicon of about 3.0 nm or less, and the result is treated with an aqueous solution of hydrofluoric acid and is subjected to thermal oxidation, allowing any of the three primary colors of light to be emitted at a low operating voltage at room temperature; or is a nanosilicon light-emitting element wherein an amorphous $SiO_x$ film consisting of a mixture of silicon atoms and oxygen atoms is formed on a semiconductor substrate, the result is heat treated in an inert gas to form the silicon atoms into nanosilicon of about 3.0 nm or less, and the result is repeatedly treated with an aqueous solution of hydrofluoric acid and is subjected to natural oxidation, allowing any of the three primary colors of light to be emitted at a low operating voltage at room temperature; and is a nanosilicon light-emitting element wherein the blue color of the three primary colors of light is emitted clearly and in a stable manner.

Furthermore, in order to solve the above-mentioned problems, the method for manufacturing a nanosilicon light-emitting element according to the present invention may also use high frequency sputtering whereby density, which is related to intensity, and size, which contributes to the color of emitted light, can be freely controlled. The nanosilicon manufactured by this method is capable of emitting light primarily in the region from yellow to near infrared. The means for easily controlling these emitted colors up through blue is one that primarily uses a treatment with an aqueous solution of hydrofluoric acid and a treatment by thermal oxidation. Also, the size of the nanosilicon can be simply controlled and a thin oxide layer that does not contain non-emissive centers can be formed on the surface of the nanosilicon with these means; therefore, red to blue light that is highly effective and that is stable over long periods of several years or more can be emitted at room temperature. In the nanosilicon-type electroluminescence element, light can be emitted at a low operating voltage because the oxide layer that increases the operating voltage can be made thinner.

BRIEF DESCRIPTION OF THE DRAWINGS

FIG. 1A is a diagram of a nanosilicon-type semiconductor substrate being subjected to hydrofluoric acid aqueous solution treatment;

FIG. 1B is an enlarged view of the nanosilicon light-emitting element of the present invention treated by thermal oxidation;

FIG. 2A is a diagram of the amorphous $SiO_x$ film to be heat treated;

FIG. 2B is an enlarged view of a semiconductor substrate with a nanosilicon/silicon oxide film;

FIG. 3A is a diagram of nanosilicon being subjected to hydrofluoric acid aqueous solution treatment;

FIG. 3B a diagram of nanosilicon immediately after treatment;

FIG. 3C is a diagram of nanosilicon immediately after the state in FIG. 3B;

FIG. 11 is an energy band diagram showing the interaction between electrons and holes in the case of a plurality of nanosilicon/silicon oxide films when a low voltage is applied.

DESCRIPTION OF THE PREFERRED EMBODIMENTS

Figure 4:
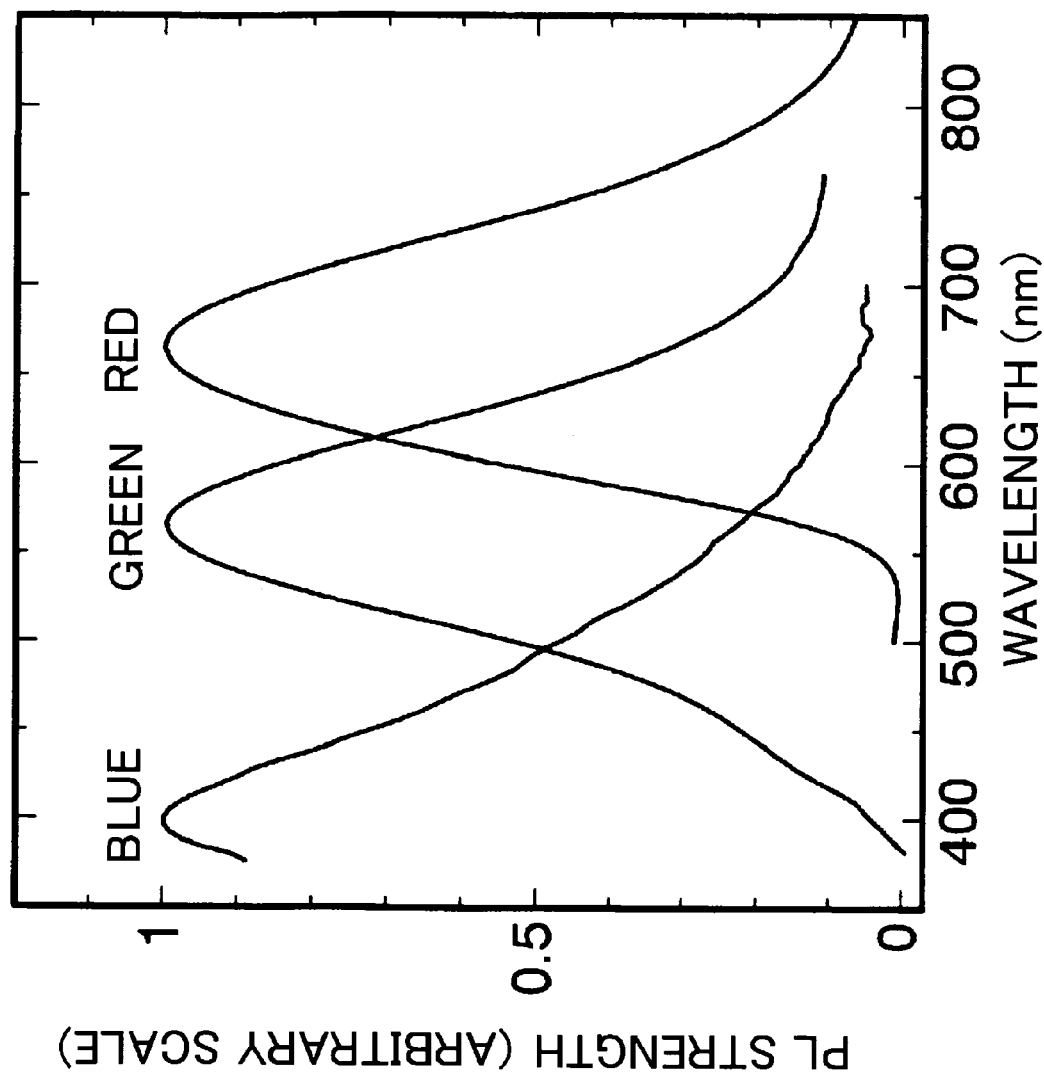
FIG. 4 a graph showing the light emission spectrum for each color of the nanosilicon light-emitting element of the present invention.

First, the nanosilicon light-emitting element of the present invention will be described. Schemata of the nanosilicon light-emitting element are as shown in FIGS. 1 and 2. An amorphous $SiO_x$ film 2 consisting of a mixture of silicon atoms and oxygen atoms is formed on a silicon substrate or other such semiconductor substrate 1 [see FIG. 2A]; the result is subjected to heat treatment 3 in argon, nitrogen, helium, or another such inert gas; and the amorphous $SiO_x$ film 2 is formed multiple times as a silicon oxide film 4b and nanosilicon (nanocrystalline silicon: nc-Si) 4a with silicon atoms of about 3.0 nm or less within the silicon oxide film 4b [see FIG. 2B]. The result is then subjected to hydrofluoric acid aqueous solution treatment 5 and thermal oxidation treatment 6 as shown in FIG. 1 to manufacture a nanosilicon light-emitting element. The nanosilicon light-emitting element emits the colors green and primarily blue, which belong to the three primary colors of light, clearly and in a stable manner at a low operating voltage 7 at room temperature.

Other possible methods for forming the amorphous $SiO_x$ film 2 besides high frequency sputtering include ion implantation, laser abrasion, CVD (Chemical Vapor Deposition), and the like. Density, which is related to intensity, and size, which contributes to the color of emitted light, can be freely controlled, particularly in the case of high frequency sputtering. Light cannot be emitted in the state of the amorphous $SiO_x$ film 2 [see FIG. 2A] because nanosilicon 4a is not yet formed. The temperature of the heat treatment 3 in an inert gas is about 900 to 1200° C. The temperature should preferably be about 1000 to 1100° C. The heat treatment 3 should last about 30 to 120 minutes. Nanosilicon 4a is formed by the heat treatment 3. The particle size, density, and other properties of nanosilicon 4a are affected by the temperature and time of the heat treatment 3. Light is emitted by nanosilicon 4a. A theory of the emitted light will be hereinafter described in detail.

The emitted colors (red, green, blue) vary depending on the procedures, methods, and other attributes of the hydrofluoric acid aqueous solution treatment 5 and thermal oxidation treatment 6. A significant factor that affects the color differences is the particle size of nanosilicon 4a. This is because nanosilicon 4a itself is exposed [see FIG. 3B] on the surface of the silicon oxide film 4b by the hydrofluoric acid aqueous solution treatment 5 [see FIG. 3A], as shown schematically in FIG. 3 as a result of many experiments. It was learned that if the particle size of nanosilicon 4a at this point is denoted by $L\phi$, the periphery of the exposed nanosilicon 4a undergoes natural oxidation immediately after the treatments to produce an oxide film as shown in FIG. 3C, and the particle size of nanosilicon 4a itself decreases to $(L-\alpha)\phi$. The hydrofluoric acid aqueous solution treatment 5 should last for about 1 to 120 minutes, and the appropriate time and concentration of the hydrofluoric acid aqueous solution 23 and the like have an effect on the particle size of nanosilicon 4a.

Figure 8:
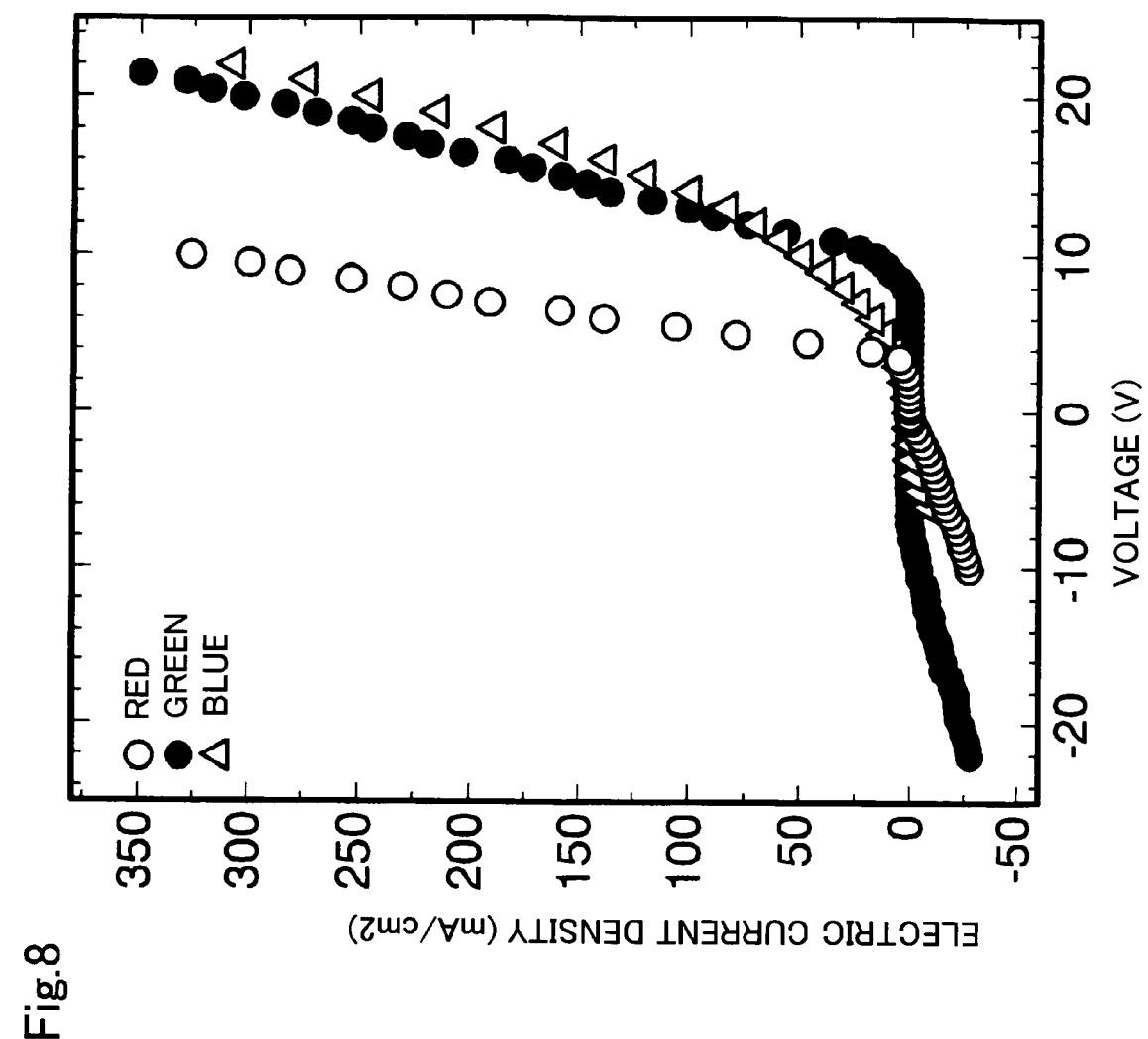
FIG. 8 is a graph showing the electric current-voltage characteristics of the nanosilicon light-emitting element.

The temperature of the thermal oxidation treatment 6 should be a low at about 400 to 800° C. The temperature is preferably about 500 to 650° C. The particle size of nanosilicon 4a in this case is about 2.2 to 2.5 nm. In this case, the color green (peak excitation frequency is 570 nm) is emitted at a low operating voltage 7 (for example, about five to ten-odd volts; the operating voltage 7 in FIG. 8 is 9.5 V) at room temperature (see FIG. 4). Also, the temperature of high-temperature oxidation should be about 800 to 1000° C., or preferably about 900 to 980° C. The particle size of nanosilicon 4a in this case is about 1.5 to 2.5 nm. The particle size is preferably about 1.9 to 2.2 nm. In this case, the blue color (peak excitation frequency is 400 nm) is emitted at a low operating voltage 7 (for example, about five to ten-odd volts; the operating voltage 7 in FIG. 8 is 10 V) at room temperature (see FIG. 4).

Also, the hydrofluoric acid aqueous solution treatment 5 alone may be sufficient to emit red light, and the thermal oxidation treatment 6 is unnecessary. In particular, a clear red color is obtained when the hydrofluoric acid aqueous solution treatment 5 is used. The particle size of nanosilicon 4a in this case is about 2.5 to 3.0 nm. In this case, the color red (peak excitation frequency is 670 nm) is emitted at a low operating voltage 7 (for example, several volts; the operating voltage 7 in FIG. 8 is 4.0 V) at room temperature (see FIG. 4). The thermal oxidation treatment 6 such as is described above should be performed for about 10 seconds to 20 minutes. The thickness of the oxide film is controlled by means of the treatment time and temperature, and, consequently, the particle size of nanosilicon 4a can be suitably controlled.

Figure 5:
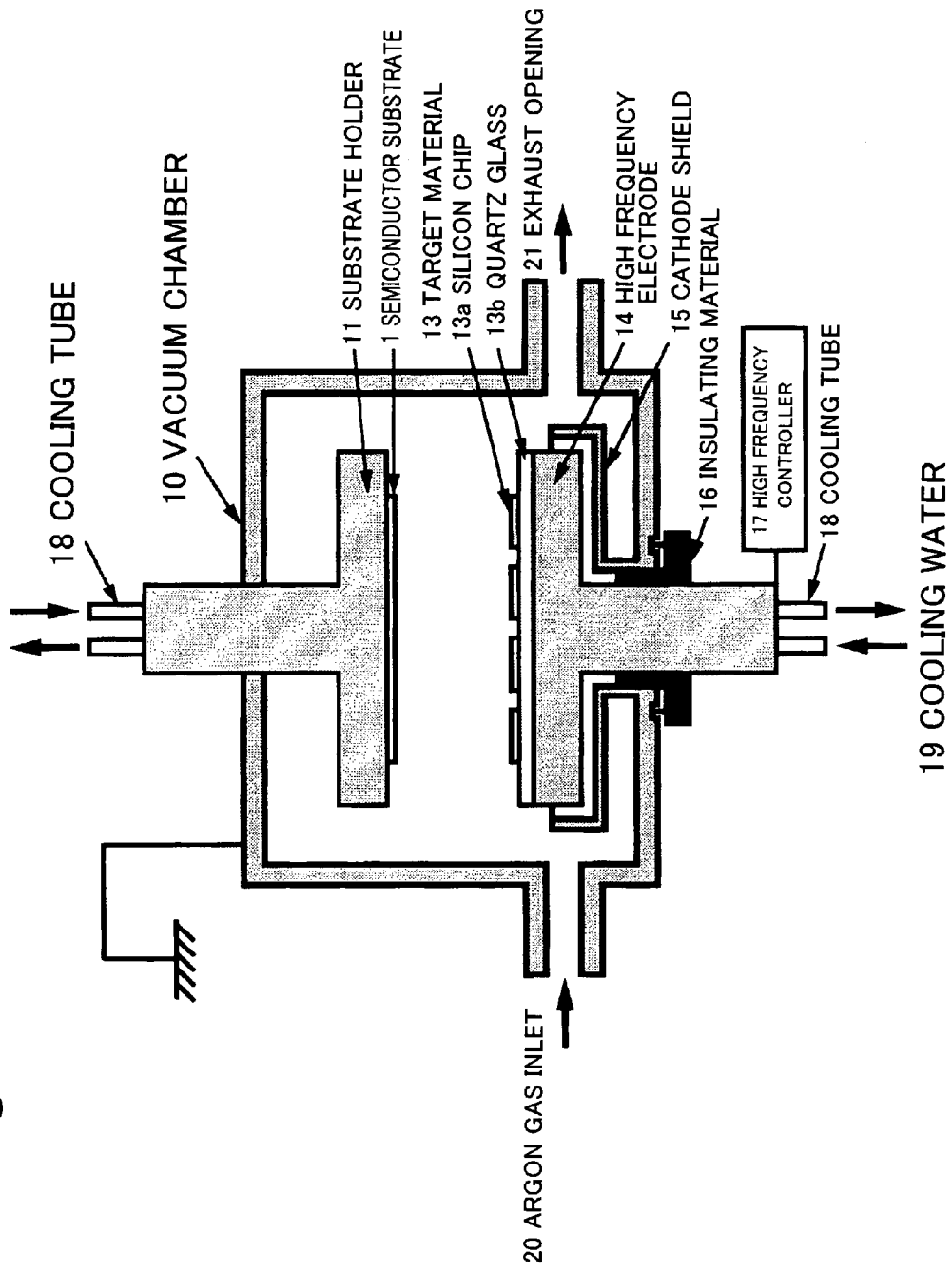
FIG. 5 is a schematic cross-sectional view of the first step for manufacturing the nanosilicon light-emitting element of the present invention.
Figure 6:
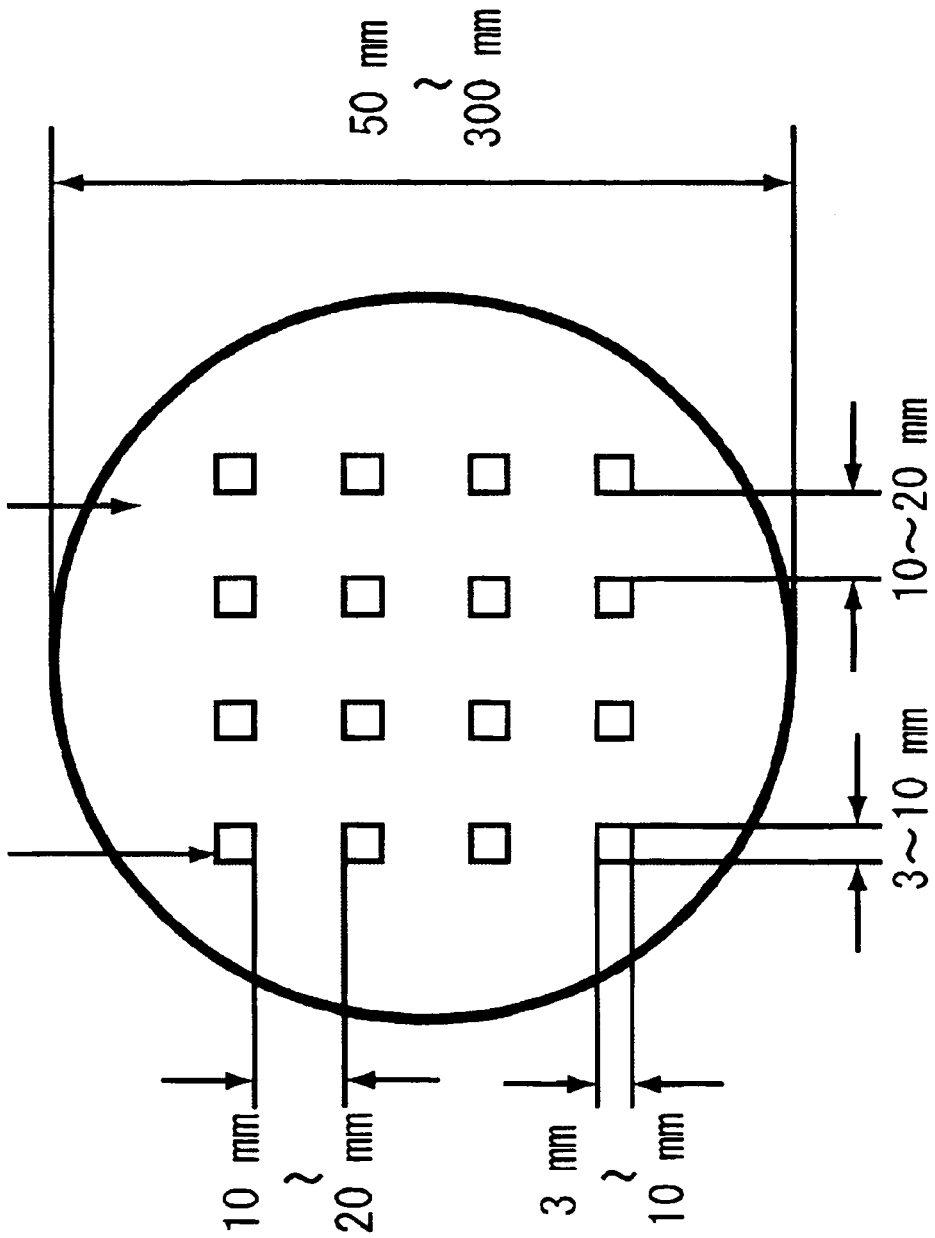
FIG. 6 is an explanatory diagram of the arrangement of the target material used in the present invention.

An outline of the method for manufacturing a nanosilicon light-emitting element of the present invention will now be described. In a high frequency sputtering device such as the one shown in FIG. 5, argon gas enters a vacuum chamber 10 through an argon gas inlet 20, argon ions that have been ionized are caused by a high frequency controller 17 to collide with a silicon chip 13a and quartz glass 13b (FIG. 6), which constitute target material 13, then the atoms and molecules discharged from the target material 13 accumulate on a semiconductor substrate 1, and an amorphous $SiO_x$ film 2 consisting of a mixture of silicon atoms and oxygen atoms is formed [see FIG. 2A]. In FIG. 5, 11 is a substrate holder, 14 is a high frequency electrode, 15 is a cathode shield, 16 is insulating material, 18 is a cooling tube, 19 is cooling water, and 21 is an exhaust outlet.

A nanosilicon 4a of about 3.0 nm or less is formed by subjecting the amorphous $SiO_x$ film 2 to heat treatment 3 in an atmosphere of argon or another such inert gas from room temperature to 1100° C. At this point, the size and density of nanosilicon 4a can be controlled because the amount of silicon in the amorphous $SiO_x$ film 2 can be varied by changing the area ratio between the silicon chip 13a and the quartz glass 13b of the target material 13 shown in FIG. 6. Furthermore, the size (particle size) of nanosilicon 4a can be easily controlled by the hydrofluoric acid aqueous solution treatment 5 and thermal oxidation treatment 6.

FIG. 1 is a schematic view of the manufacture of a nanosilicon light-emitting element by the hydrofluoric acid aqueous solution treatment 5 and thermal oxidation treatment 6. A resin container 22 [Teflon® container] containing a hydrofluoric acid aqueous solution 23 is used for the hydrofluoric acid aqueous solution treatment 5. A semiconductor substrate 1 (test specimen) provided with a silicon oxide film 4b containing a large number of nanosilicon 4a particles is placed in the resin container 22, and the hydrofluoric acid aqueous solution treatment 5 is performed so that nanosilicon 4a is exposed evenly on the surface layer of the specimen. After this treatment, the surface of nanosilicon 4a exposed on the surface layer of the specimen is oxidized by the thermal oxidation treatment 6 and reduced in size (particle size). The size at this time decreases with increased thermal oxidation temperature (about 400 to 1000° C.). The hydrofluoric acid aqueous solution treatment 5 and natural oxidation treatment 9 may also be alternately performed instead of the thermal oxidation treatment 6 alone. With the natural oxidation treatment 9, the system is allowed to stand for two days, and the same results as with the thermal oxidation treatment 6 are obtained.

FIG. 4 is a photoluminescence spectrum observed when nanosilicon 4a manufactured by high frequency sputtering is subjected to the hydrofluoric acid aqueous solution treatment 5 and thermal oxidation treatment 6. As is clear from these diagrams, red, green, and blue light can be emitted as a result of the hydrofluoric acid aqueous solution treatment 5 and thermal oxidation treatment 6. Also, light emitted in this case can be seen clearly by the naked eye even in room lighting, as shown in the appended photographs, when excited by exposure to an ultraviolet laser.

In experiments performed by the applicant, the emission life of specimens that emitted light in red, green, and blue colors was also measured, and the specimens exhibited a life that ranged from microseconds to nanoseconds as the emission wavelength shifted towards lower wavelengths. It was then confirmed that the size of nanosilicon 4a was reduced by means of the thermal oxidation treatment 6. These results suggest that a shift in the emission wavelength reflects the size of nanosilicon 4a, and it can be concluded that all the emitted light is generated by nanosilicon 4a itself. Thus, emission of red to blue light by silicon alone can be achieved using extremely simple measures.

Figure 7:
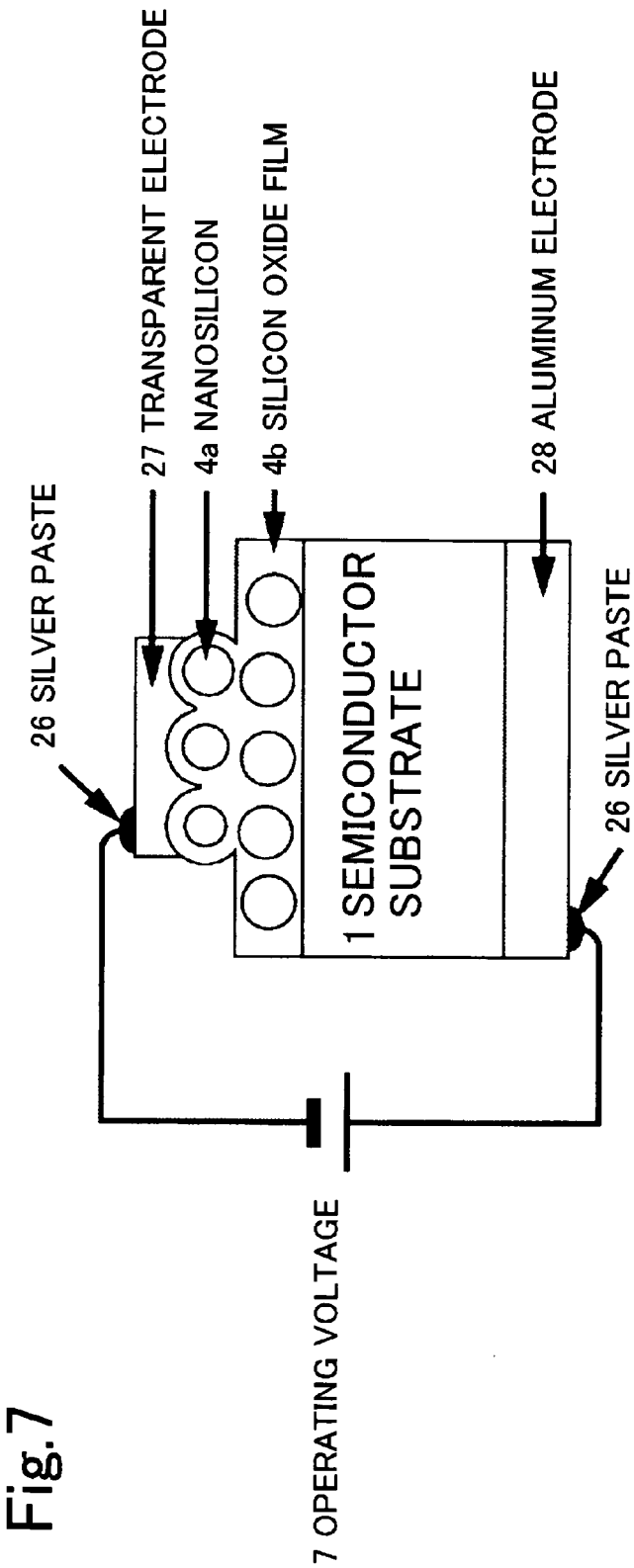
FIG. 7 is a schematic explanatory diagram of the configuration whereby the nanosilicon light-emitting element is caused to emit light at an operating voltage (direct-current power source)

An embodiment of the development of a nanosilicon-type electroluminescence element will now be described. FIG. 7 is a schematic explanatory diagram of a cross-sectional structure of a nanosilicon-type electroluminescence element. In the nanosilicon-type electroluminescence element, nanosilicon 4a that emits light in the colors red, green, and blue in the silicon oxide film 4b is first formed on the semiconductor substrate 1; indium tin oxide, which is a transparent electrode 27, is provided to nanosilicon 4a; and an aluminum electrode 28 is provided to the back surface of the semiconductor substrate 1. Silver paste 26, 26 is provided both to the transparent electrode 27 and to the aluminum electrode 28; an operating voltage 7 (a low voltage, for example, 10 V or less) is applied between the silver paste 26, 26; and an electric current is caused to flow through the nanosilicon light-emitting element, causing nanosilicon 4a to emit red, green, and blue light.

FIG. 8 shows the electric current-voltage characteristics of the nanosilicon-type electroluminescence element shown in FIG. 7. The electric current-voltage characteristics are shown for a case in which the voltage is applied in the forward direction, wherein the aluminum electrode 28 is the positive terminal, and the transparent electrode 27, or, specifically, the indium tin oxide electrode, is the negative terminal. As is clear from these diagrams, rectification is exhibited for all colors, and carrier injection occurs in nanosilicon 4a at a forward voltage of 10.0 V or less. After the carrier injection, emission of red, green, and blue light was confirmed.

Increasing the amount of injected carriers resulted in an increase in light emission efficiency, and light emission that was sufficiently strong to be seen by the naked eye was produced for all colors at an operating voltage 7 of 10.0 V or less. The emission was stable enough to enable continuous operation over long periods of time with every color of emitted light. It is only with the procedures of the present invention that such light emission could be obtained. The hydrofluoric acid aqueous solution treatment 5 and thermal oxidation treatment 6 are effective for application in light-emitting elements. This makes it possible to produce high-efficiency sustained emission at a low operating voltage 7 because an oxide layer with no non-emissive centers can be formed on the surface of nanosilicon 4a, and the thickness of the oxide layer can be reduced.

The nanosilicon light-emitting element according to the present invention as described above allows full-color (red, green, blue) light emission to be obtained in the visible region by relatively simple methods. It is therefore possible to design an optoelectric element or the like wherein an electroluminescence display composed of silicon, a light-emitting diode, and a semiconductor laser or silicon alone are assembled on the same substrate through the use of a nanosilicon light-emitting element.

The fundamental theory by which the nanosilicon light-emitting element of the present invention emits light will now be described in detail. Two types of defects are present in the amorphous $SiO_x$ film 2 previously described; specifically, Si dangling bonds and E'-centers that originate in an oxygen vacancy. When the film in this state is subjected to heat treatment 3 in an atmosphere of argon between 400 and 800° C., the excess of Si atoms present in the amorphous $SiO_x$ film 2 begins to move vigorously and gradually begins to aggregate. The two types of defects, specifically, the Si dangling bonds and E'-centers, are reduced in number in this step. Nanosilicon 4a having a size of about 3.0 nm or less can then be formed at a location that extends from the area of aggregation of the Si atoms to the inside of the silicon oxide film 4b by raising the temperature of the heat treatment 3 to 900° C. or more, and emission of red light is observed.

Figure 9:
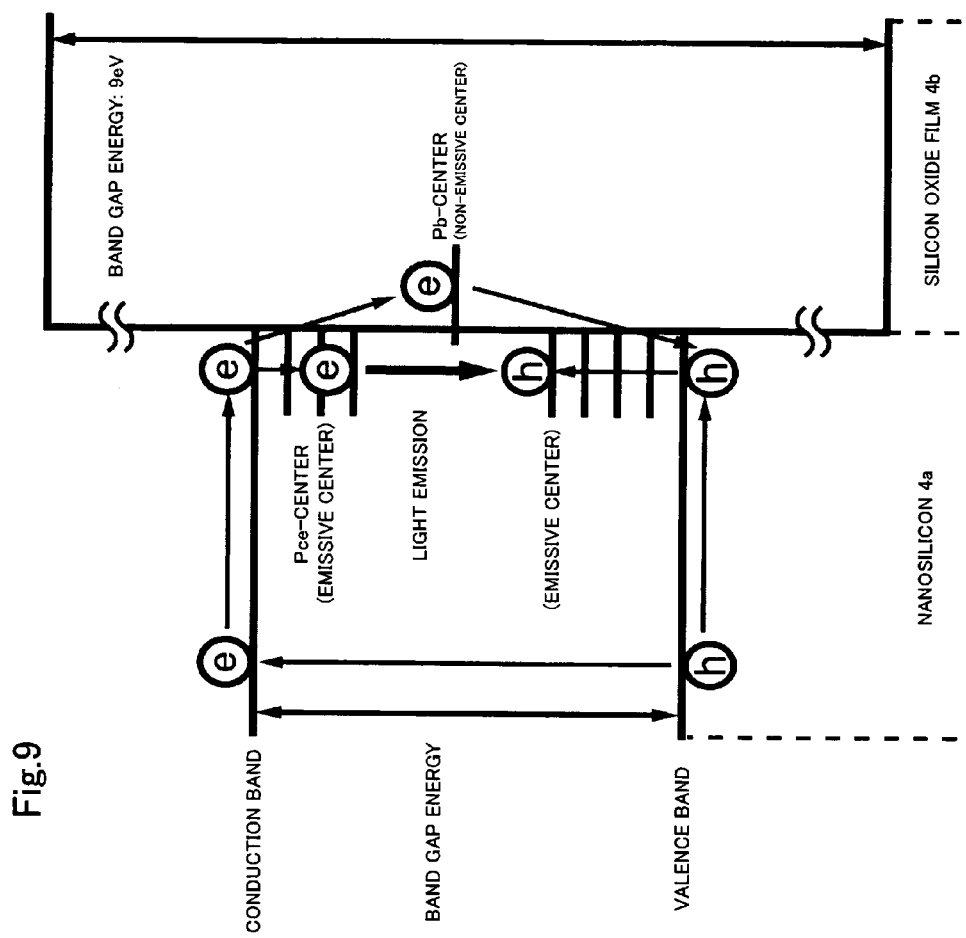
FIG. 9 is an energy band diagram showing the interaction between electrons and holes when light is incident on a nanosilicon/silicon oxide film that has not been subjected to hydrofluoric acid aqueous solution treatment or thermal oxidation treatment.

However, the light emission efficiency is extremely low at this temperature because of the as yet low density of nanosilicon 4a and because of the combined presence of amorphous centers in or near the surface of nanosilicon 4a (silicon dangling bonds in nanosilicon 4a), $P_b$-centers (silicon dangling bonds on the surface of nanosilicon 4a/oxide layer) or other such non-emissive centers and $P_{ce}$-centers (electrons e captured at the localized level on the lower end of the conduction band near the surface of nanosilicon 4a), ESR centers originating in the holes h captured at the localized level on the upper end of the valence band near the surface of nanosilicon 4a, and other such emissive centers, as shown in FIG. 9. Furthermore, when the heat treatment temperature is raised to 1100° C., an increase in emission strength is observed. At this temperature, the light emitting efficiency increases somewhat because the density of nanosilicon 4a increases, the number of emissive centers increases, and the number of non-emissive centers decreases as well. The light emitted from nanosilicon 4a at this point is generated as follows.

Light is emitted by irradiation with excitation energy equal to or greater than the band gap energy of nanosilicon 4a, and the light emitting energy is generated at or below the band gap energy. This is because the surface of nanosilicon 4a is covered with an oxide layer. Emissive centers ($P_{ce}$-centers and ESR centers originating in the holes) and non-emissive centers ($P_b$-centers) are present in the interface between nanosilicon 4a and the oxide film. The process in which the electrons e and holes h recombine in such a relationship has only two types of steps. Specifically, one is the step of passing through an emissive center, and the other is the step of passing through a non-emissive center. The following light emitting mechanism was therefore established.

The electrons are excited from the valence band to the conduction band by irradiating nanosilicon 4a to excitation energy equal to or greater than the band gap. The electrons excited into the conduction band and the holes in the valence band are captured at the localized level near the lower end of the conduction band and at the localized level near the upper end of the valence band, respectively. Light is emitted by the recombination of electrons e and holes h between these localized levels.

Recombination of the electrons e and holes h brings about transitions via the $P_b$-centers (non-emissive centers) in addition to the transitions between the localized levels. However, the $P_b$-center (non-emissive center) shown in FIG. 9 is at a level where the emission strength is reduced. Therefore, shortening the recombination process of the electrons e and holes h via the $P_b$-center causes an improvement in emission strength. In practice, a nanosilicon 4a with non-emissive centers ($P_b$-centers) remaining on the surface is unsuitable for application to a light-emitting element. No emission was actually observed when an electroluminescence element was manufactured using this nanosilicon 4a.

Figure 10:
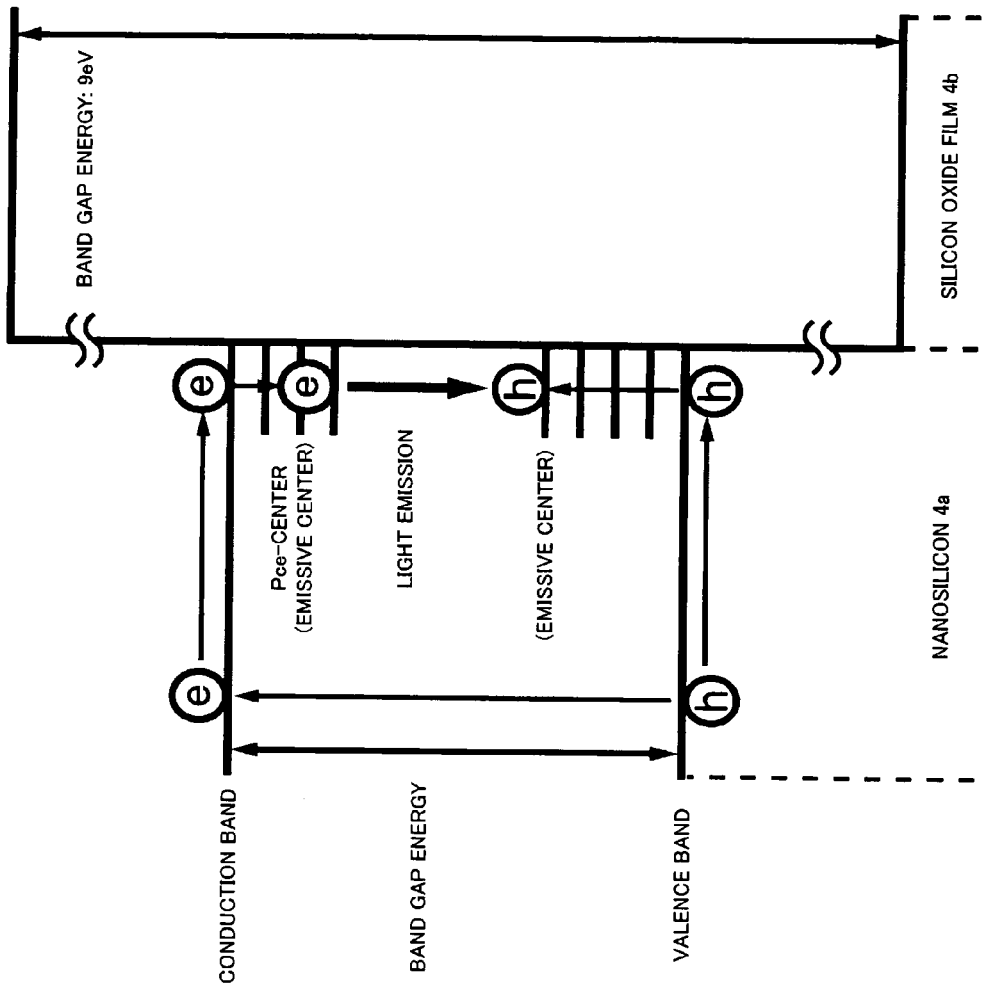
FIG. 10 is an energy band diagram showing the interaction between electrons and holes when light is incident on a nanosilicon/silicon oxide film that has been subjected to either hydrofluoric acid aqueous solution treatment or thermal oxidation treatment.

Therefore, a technique using hydrofluoric acid aqueous solution treatment 5 was devised to allow light to be emitted efficiently. The hydrofluoric acid aqueous solution treatment 5 involves the following steps. (1) The oxide layer covering the surface of nanosilicon 4a is removed, and nanosilicon 4a is exposed on the surface layer of the test specimen. (2) The $P_b$-centers (non-emissive centers) on the surface of nanosilicon 4a are efficiently removed by hydrogen. As a result, it is possible to create a condition in which only emissive centers ($P_{ce}$-centers) remain on the surface of nanosilicon 4a, as shown in FIG. 10. Therefore, the light emitting efficiency is markedly improved in comparison with the condition existing before the hydrofluoric acid aqueous solution treatment 5, and the strength thereof is sufficient to be discerned by the naked eye even in indoor lighting. Recombination of the electrons e and holes h has only one type step in a system in which hydrofluoric acid aqueous solution treatment 5 is applied. In other words, there are no $P_b$-centers on the surface of nanosilicon 4a, so the transition between the localized levels becomes predominant. Thus, light can be emitted efficiently by improving the efficiency of emission/recombination between the localized levels.

Furthermore, the desorption of the hydrogen at the terminals of the $P_b$-centers is suppressed and stable light can be emitted for a long time by forming a thin natural oxide layer on the surface of nanosilicon 4a after the hydrofluoric acid aqueous solution treatment 5. For example, emission strength quickly deteriorates with porous silicon having many $P_b$-centers, which are non-emissive centers. Therefore, the reason that light can be emitted in a stable manner even over long periods of time is that emissive centers alone are present on the surface of nanosilicon 4a in a stable manner. Furthermore, the color of the emitted light can be easily varied when thermal oxidation treatment 6 is applied to nanosilicon 4a that has been subjected to the hydrofluoric acid aqueous solution treatment 5.

In the case of the nanosilicon light-emitting element developed in the present invention, the oxide layer covering the surface of nanosilicon 4a is removed and nanosilicon 4a is exposed on the surface of the test specimen by the hydrofluoric acid aqueous solution treatment 5. Also, a thin oxide film is formed on the surface of nanosilicon 4a after the hydrofluoric acid aqueous solution treatment 5. Therefore, the overall resistance of the nanosilicon light-emitting element developed in the present invention is reduced. Thus, carriers can be injected into nanosilicon 4a at a low operating voltage 7 of 10.0 V or less.

Furthermore, recombination of the electrons e and holes h is essentially the same as with the photoluminescence technique (which is a method for emitting light by irradiating nanosilicon 4a with excitation energy equal to or greater than the band gap, rather than a method for emitting light by applying voltage). However, the electrons e and holes h are created by the application of voltage to an electroluminescence element. Also, when a low operating voltage 7 is applied to the element, a thin oxide film between the indium tin oxide electrode and nanosilicon 4a, between each nanosilicon 4a, and between nanosilicon 4a and the silicon substrate causes the band to bend as shown in FIG. 11. Thus, the electrons e in the indium tin oxide electrode and the holes h in the silicon substrate tunnel into their respective oxide layers and are then efficiently injected into nanosilicon 4a.

The electrons e and holes h injected into nanosilicon 4a are then captured by the localized levels near the lower end of the conduction band and near the upper end of the valence band. Light can be emitted at high external quantum efficiency by the recombination of the electrons e and holes h captured at these localized levels. The operation can continue in a stable manner for a long time with each color of emitted light (red, green, blue). The emission strength rapidly decreases as time passes in the natural atmosphere in the case of an element that uses porous silicon. This is because of an increase in the number of non-emissive centers ($P_b$-centers) in the surface of nanosilicon 4a. The $P_b$-centers in the surface of nanosilicon 4a are terminated with hydrogen in the case of the nanosilicon light-emitting element developed in the present invention. However, forming a thin oxide film on the surface of nanosilicon 4a following the hydrofluoric acid aqueous solution treatment 5 prevents the hydrogen from being desorbed from the surface for a long time. It has been confirmed that only emissive centers are present in the surface in a stable manner after a long time has passed. Therefore, the nanosilicon light-emitting element developed in the present invention can emit light efficiently and in a stable manner during long, continuous operations.

In the present invention, the emission wavelength can be arbitrarily varied by means of silicon alone through the use of relatively simple measures. The nanosilicon light-emitting element can emit long-lasting red to blue light with a high degree of intensity at a low operating voltage, and can therefore be used as an element in an extremely wide range of applications. Furthermore, a simple manufacturing method makes it possible to control the size of the nanosilicon and to subject the nanosilicon to a stable technique such as an oxidation treatment, and is therefore highly advantageous in that light (particularly blue light) can be emitted clearly and in a stable manner.

What is claimed is:

1. A nanosilicon light-emitting element, comprising:
   an amorphous $SiO_x$ film comprising a mixture of silicon atoms and oxygen atoms formed on a semiconductor substrate, said amorphous $SiO_x$ film being heat treated in an inert gas to form the silicon atoms into nanosilicon of about 3.0 nm or less,
   wherein said amorphous $SiO_x$ film including said nanosilicon is treated with an aqueous solution of hydrofluoric acid and subjected to thermal oxidation to allow at least one of three primary colors of light to be emitted at a low operating voltage at room temperature.

2. A nanosilicon light-emitting element, comprising:
   an amorphous $SiO_x$ film comprising a mixture of silicon atoms and oxygen atoms formed on a semiconductor substrate, said amorphous $SiO_x$ film being heat treated in an inert gas to form the silicon atoms into nanosilicon of about 3.0 nm or less,
   wherein said amorphous $SiO_x$ film including said nanosilicon is repeatedly treated with an aqueous solution of hydrofluoric acid and subjected to natural oxidation to allow at least one of three primary colors of light to be emitted at a low operating voltage at room temperature.

3. The nanosilicon light-emitting element according to claim 1, wherein a blue color of the three primary colors of light is emitted clearly and in a stable manner.

4. The nanosilicon light-emitting element according to claim 1, wherein the semiconductor substrate comprises a silicon substrate, and a temperature of the heat treatment comprises a temperature in a range of about 900° C. to 1200° C.

5. The nanosilicon light-emitting element according to claim 1, wherein a temperature of the thermal oxidation treatment comprises a temperature in a range of about 400° C. to 1000° C.

6. The nanosilicon light-emitting element according to claim 1, wherein the nanosilicon is formed by high frequency sputtering.

7. A method for manufacturing a nanosilicon light-emitting element, comprising:
   forming an amorphous $SiO_x$ film comprising a mixture of silicon atoms and oxygen atoms on a semiconductor substrate;
   heat treating said amorphous $SiO_x$ film in an inert gas to form the silicon atoms into nanosilicon of about 3.0 nm or less; and
   subjecting said amorphous $SiO_x$ film including said nanosilicon to treatment with an aqueous solution of hydrofluoric acid and thermal oxidation to allow at least one of three primary colors of light to be emitted at a low operating voltage at room temperature.

8. A method for manufacturing a nanosilicon light-emitting element, comprising:
   forming an amorphous $SiO_x$ film comprising a mixture of silicon atoms and oxygen atoms on a semiconductor substrate;
   heat treating said amorphous $SiO_x$ film in an inert gas to form the silicon atoms into nanosilicon of about 3.0 nm or less; and
   subjecting said amorphous $SiO_x$ film including said nanosilicon repeatedly to treatment with an aqueous solution of hydrofluoric acid and natural oxidation to allow at least one of three primary colors of light to be emitted at a low operating voltage at room temperature.

9. The method for manufacturing a nanosilicon light-emitting element according to claim 7, wherein a blue color of the three primary colors of light is emitted clearly and in a stable manner.

10. The method for manufacturing a nanosilicon light-emitting element according to claim 7, wherein the semiconductor substrate comprises a silicon substrate, and a temperature of the heat treatment comprises a temperature in a range of about 900° C. to 1200° C.

11. The method for manufacturing a nanosilicon light-emitting element according to claim 7, wherein a temperature of the thermal oxidation treatment comprises a temperature in a range of about 400° C. to 1000° C.

12. The method for manufacturing a nanosilicon light-emitting element according to claim 7, wherein the nanosilicon is formed by high frequency sputtering.

13. The nanosilicon light-emitting element according to claim 2, wherein a blue color of the three primary colors of light is emitted clearly and in a stable manner.

14. The nanosilicon light-emitting element according to claim 2, wherein the semiconductor substrate comprises a silicon substrate, and a temperature of the heat treatment comprises a temperature in a range of about 900° C. to 1200° C.

15. The nanosilicon light-emitting element according to claim 2, wherein a temperature of the thermal oxidation treatment comprises a temperature in a range of about 400° C. to 1000° C.

16. The nanosilicon light-emitting element according to claim 2, wherein the nanosilicon is formed by high frequency sputtering.

17. The method for manufacturing a nanosilicon light-emitting element according to claim 8, wherein a blue color of the three primary colors of light is emitted clearly and in a stable manner.

18. The method for manufacturing a nanosilicon light-emitting element according to claim 8, wherein the semiconductor substrate comprises a silicon substrate, and a temperature of the heat treatment comprises a temperature in a range of about 900° C. to 1200° C.

19. The method for manufacturing a nanosilicon light-emitting element according to claim 8, wherein a temperature of the thermal oxidation treatment comprises a temperature in a range of about 400° C. to 1000° C.

20. The method for manufacturing a nanosilicon light-emitting element according to claim 8, wherein the nanosilicon is formed by high frequency sputtering.

21. The nanosilicon light-emitting element according to claim 1, wherein at least a portion of said nanosilicon comprises nanosilicon formed on a surface of said amorphous $SiO_x$ film.

* * * * *